United States Patent
Liu

(10) Patent No.: US 9,967,999 B2
(45) Date of Patent: May 8, 2018

(54) DEVICE FOR CONTROLLING HEAT DISSIPATION FAN AND ELECTRONIC EQUIPMENT

(71) Applicant: ZTE CORPORATION, Shenzhen, Guangdong Province (CN)

(72) Inventor: Faju Liu, Shenzhen (CN)

(73) Assignee: ZTE Corporation, Shenzhen, Guangdong Province (CN)

( * ) Notice: Subject to any disclaimer, the term of this patent is extended or adjusted under 35 U.S.C. 154(b) by 333 days.

(21) Appl. No.: 14/427,371

(22) PCT Filed: Aug. 15, 2013

(86) PCT No.: PCT/CN2013/081519
§ 371 (c)(1),
(2) Date: Mar. 11, 2015

(87) PCT Pub. No.: WO2014/040468
PCT Pub. Date: Mar. 20, 2014

(65) Prior Publication Data
US 2015/0237765 A1    Aug. 20, 2015

(30) Foreign Application Priority Data

Sep. 11, 2012    (CN) .......................... 2012 1 0334065

(51) Int. Cl.
*H05K 7/20*    (2006.01)
*G05B 15/02*    (2006.01)

(52) U.S. Cl.
CPC ......... *H05K 7/20209* (2013.01); *G05B 15/02* (2013.01)

(58) Field of Classification Search
CPC ........................... H05K 7/20209; G05B 15/02
See application file for complete search history.

(56) References Cited

U.S. PATENT DOCUMENTS 5,906,315 A * 5/1999 Lewis .................. F24F 11/0086
236/49.3
2002/0039014 A1    4/2002 Kudo et al.
(Continued)

FOREIGN PATENT DOCUMENTS

CN    2616727 Y    5/2004
CN    101165354 A    4/2008
(Continued)

OTHER PUBLICATIONS

Wang, Shaojun, Fan time delay control circuit, Published Apr. 6, 2011, CN 102003399 A—machine translation acquired by internal STIC service by USPTO and cited as 'Wang' in the office action.*

*Primary Examiner* — Sean Shechtman
*Assistant Examiner* — Marzia T Monty
(74) *Attorney, Agent, or Firm* — Ling Wu; Stephen Yang; Ling and Yang Intellectual Property

(57) ABSTRACT

Disclosed are a device for controlling a heat dissipation fan and an electric equipment, to solve the problem that the reliability of speed-regulation control for a fan in the device for controlling a heat dissipation fan is relatively poor. The device includes a control system and a protection module, wherein the protection module includes a control signal output end for outputting a fan speed-regulation control signal to the fan, wherein, when a control system normal operation indication signal is normal, the control signal output end of the protection module outputs the fan speed-regulation control signal provided by the control system, otherwise the protection module outputs a fan speed-regulation control signal preset by itself so as to make the fan operate stably.

18 Claims, 2 Drawing Sheets

(56) References Cited

U.S. PATENT DOCUMENTS

| | | | |
|---|---|---|---|
| 2002/0063478 A1 | 5/2002 | Huang et al. | |
| 2004/0247449 A1 | 12/2004 | Ma et al. | |
| 2007/0070994 A1* | 3/2007 | Burroughs | G06F 1/206 370/381 |
| 2010/0109591 A1* | 5/2010 | Yeh | H05K 7/20209 318/445 |

FOREIGN PATENT DOCUMENTS

| | | |
|---|---|---|
| CN | 201622517 U | 11/2010 |
| CN | 102003399 A | 4/2011 |
| CN | 102828980 A | 12/2012 |
| RU | 15410 U1 | 10/2000 |

* cited by examiner

DEVICE FOR CONTROLLING HEAT DISSIPATION FAN AND ELECTRONIC EQUIPMENT

TECHNICAL FIELD

The present document relates to the field of electronic circuit technology, and more particularly, to a device for controlling heat dissipation fan and an electronic equipment.

BACKGROUND

Today, most of electronic equipments such as computer and communication equipment are installed with heat dissipation fans to meet the heat dissipation needs of the system and to ensure the stability of the system. Currently, usually a device for controlling heat dissipation fan directly controls speed regulation for a fan through a control signal when monitoring and regulating speed of the fan, this method of directly and electrically connecting with the fan through a control signal has considerable risks and shortcomings, when an equipment works unstably or malfunctions during the power up, the fan cannot be controlled effectively, making the status of the fan uncontrollable, for example: the fan stops or the rotating speed of the fan is slow, and the heat dissipation of the equipment cannot be met, resulting in overheating damage of key chips in the equipment.

SUMMARY

The objective of the present document is to provide a device for controlling a heat dissipation fan to solve the problem in the prior art that the reliability of controlling speed regulation for a fan in a device for controlling heat dissipation fan is poor.

A device for controlling a heat dissipation fan provided in the present document comprises: a first signal output end and a second signal output end of a control system for controlling a speed-regulation for a fan and monitoring the fan, which are respectively connected with a first signal input end and a second signal input end of a protection module, wherein the protection module further comprises a control signal output end for outputting a fan speed-regulation control signal to the fan, wherein the first signal is a control system normal operation indication signal, and the second signal is a fan speed-regulation control signal output by the control system, wherein when the control system normal operation indication signal is normal, the protection module controls the signal output end to output the fan speed-regulation control signal provided by the control system, otherwise the protection module outputs a fan speed-regulation control signal preset by itself to make the fan operate stably.

Preferably, a third signal input end of the control system is connected with a third signal output end of the protection module, the protection module further comprises a third signal input end, and the third signal is a fan speed signal, wherein, the protection module internally connects the third signal output end with the third signal input end when the control system normal operation indication signal is normal.

Preferably, the third signal input end of the control system is connected with the third signal output end of the protection module, the protection module further comprises a third signal input end, and the third signal is a fan speed signal, wherein the protection module internally disconnects its third signal output end with its third signal input end when the control system normal operation indication signal is abnormal.

Preferably, a fourth signal input end of the control system is connected with a fourth signal output end of the protection module, the fourth signal is a protection module acknowledgment response feedback signal, wherein when the control system normal operation indication signal is normal, the fourth signal output end of the protection module outputs a protection module acknowledgment response feedback signal to the control system to notify the control system that the fan operation control is controlled by the control system.

Preferably, it further comprises an isolation module, a control signal input end of the isolation module is connected with a control signal output end of the protection module, a fan speed-regulation control signal output by the protection module is input through the control signal input end of the isolation module, and output through a control signal output end of the isolation module via a first optical coupler provided within the isolation module.

Preferably, a third signal output end of the isolation module is connected with the third signal input end of the protection module, a third signal is input through a third signal input end of the isolation module and output through the third signal output end of the isolation module via a second optical coupler provided within the isolation module.

Preferably, the isolation module is further provided with external pull-up and pull-down resistors matching with the first and second optical couplers.

Preferably, the protection module is an integrated circuit chip or a programmable logic device.

The present document further provides an electronic equipment, comprising a fan and the abovementioned device, wherein a fan speed-regulation control signal output by the device is connected with the fan.

Preferably, the fan is a four-wire speed-regulation fan or a three-wire speed-regulation fan.

In the embodiments of the present document, since the protection module outputs its own preset fan speed-regulation control signal to make the fan operate stably when the control system does not operate normally, the reliability of controlling speed regulation for a fan is enhanced and the reliability and stability of the heat dissipation fan is improved.

PREFERRED EMBODIMENTS OF THE DOCUMENT

Hereinafter in conjunction with the accompanying figures and the specific embodiments, the present document will be described in detail.

Figure 1:
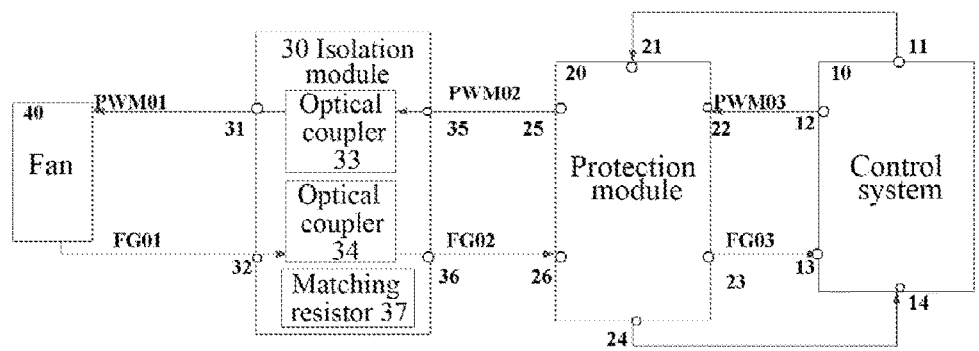
FIG. 1 is a schematic diagram of a device provided in an embodiment of the present document.

The electronic equipment provided in the embodiment of the present document is shown in FIG. 1, the device for controlling heat dissipation fan in the electronic equipment comprises control system 10 and protection module 20, the device for controlling heat dissipation fan may be a separate card and module. Wherein the control system 10 controls the speed regulation for the fan and monitors the fan. The control system 10 comprises output end 11 and output end 12, the protection module 20 comprises input end 21 and input end 22, and the output end 11 and the output end 12 are respectively connected with the input end 21 and the input end 22, the control system 10 normal operation indication signal is output from the output end 11 to the input end 21, and the fan speed-regulation control signal PWM03 output by the control system 10 is output from the output end 12 to the input end 22, the protection module 20 further comprises a control signal output end 25, the protection module 20 outputs a fan speed-regulation control signal to the fan through the control signal output end 25, wherein when the control system normal operation indication signal is normal, the control signal output end 25 of the protection module 20 outputs the fan speed-regulation control signal output by the control system, otherwise outputs a fan speed regulation control signal preset by itself, to make the fan operate stably. At this point, because the protection module cuts off the control of the control system on the fan when the control system does not operate properly and outputs the fan speed-regulation control signal preset by the protection module itself to make the fan operate stably, the speed-regulation control capability of the fan is enhanced and the system reliability is improved.

Furthermore, the scheme in the embodiment of the present document can also monitor the fan speed signal sent by the fan, the control system 10 further comprises an input end 13, and the protection module 20 further comprises an output end 23. The input end 13 of the control system 10 is connected with the output end 23 of the protection module, the output end 23 of the protection module 20 outputs a fan speed signal FG03 to the input end 13 of the control system 10, the protection module 20 further comprises an input end 26, the fan speed signal sent by the fan is input through the input end 26, wherein when the control system normal operation indication signal is normal, the protection module internally connects its output end 23 with its input end 26, so that the fan speed signal sent by the fan end is directly fed back to the control system 10. Of course, when the control system normal operation indication signal is abnormal, the protection module can also internally disconnect its output end 23 and its input end 26, so as to directly feed back the fan speed signal sent by the fan end to the protection module 20.

The input end 14 of the control system 10 connects with the output end 24 of the protection module, a protection module acknowledgment response feedback signal is output from the output end 24 to the input end 14 of the control system 10, wherein when the control system normal operation indication signal is normal, the output end 24 of the protection module 20 outputs a protection module acknowledgment response feedback signal to the control system, to inform the control system that the fan control is currently transferred to the control system.

The control signal input end 35 of the isolation module 30 is connected with the control signal output end 25 of the protection module 20, the fan speed-regulation control signal PWM02 output by the protection module 20 is input from the control signal input end 35 of the isolation module 30 and output from the control signal output end 31 of the isolation module 30 through the first optical-coupler 33 provided within the isolation module 30, to obtain a fan speed-regulation control signal PWM01 after the optical-coupler isolation. The output end 36 of the isolation module 30 is connected with the input end 26 of the protection module, and the fan speed signal FG01 sent by the fan end is input through the input end 32 of the isolation module 30, and output through the output end 36 of the isolation module 30 via the second optical coupler 34 provided within the isolation module, therefore, the optically isolated fan speed signal FG02 is output through the output end 36 of the isolation module 30.

The isolation module 30 is further provided with an external pull-up pull-down resistor 37 matching with the first optical coupler 33 and the second optical coupler 34. The isolation module provides electrical isolation for the fan, thereby greatly enhancing the anti-interference capability.

The basic structure of the electronic equipment comprises fan 40, including the fan 40 and the abovementioned device for controlling heat dissipation fan, and the fan speed regulation control signal output by the device is connected with the fan.

The scheme of the present embodiment can form the fan and the device control system into two independent systems without direct electrical connection, meanwhile the device for controlling heat dissipation fan is not stable or is malfunctioning when the device is powered on, the control system cannot effectively control and monitor the fan system, the protection module makes the fan operate stably according to the preset state in order to meet the heat dissipation needs of the device, when the control system is back to normal and can effectively control and monitor the fan, the protection module is notified to switch back to the normal mode, and the control system controls and monitors the fan. It can be seen that through the abovementioned scheme, the reliability and anti-interference of the fan in the electronic equipment can be greatly enhanced.

The embodiment of the present document further provides a method for isolating and protecting a speed-regulation fan, comprising: by isolating the fan control signal and the fan speed signal, complete isolation with the control system in electrical connection can be achieved, and by adding the protection control, the protection module controls the fan when the device is not stable or malfunctioning when being powered on and the control system cannot effectively control and monitor the fan system, and after the system returns to normal, the fan control is automatically transferred to the control system.

The device for controlling heat dissipation fan provided in the embodiment of the present document adds an optical coupler isolation module to isolate the fan speed-regulation control signal such as PWM (Pulse Width Modulation), and isolate the fan speed monitoring signal such as the FG (Frequency Generator), so as to achieve complete electrical isolation of the control system and the fan system. Through the protection module, the device is not stable or malfunctioning when being powered on, the control system cannot effectively control and monitor the fan system, the protection module makes the fan operate stably according to the preset state to meet the heat dissipation needs of the device, when the control system turns back to normal and can effectively control and monitor the fan, the protection module is notified to switch back to the normal mode, and the control system controls and monitors the fan. Wherein, the PWM controls the fan speed based on the output duty, the FG specifically calculates the fan speed according to the fan feedback pulse frequency, and two descending pulses are output after the fan rotates a cycle.

The electronic equipment is provided with a variable-speed fan system, a control system, an isolation module, and a protection module, and the isolation module and the protection module are used to electrically isolate the fan system and the control system, and control the fan system through the protection module when the control system is instable or malfunctioning, so as to ensure the heat dissipation of the communication system.

In the following, the respective units will be described in further detail.

Fan system: which comprises various fans in the device.

Control system: which mainly controls the speed regulation of and monitors the fan, meanwhile outputs a normal operation message to the protection module.

Isolation module: which completes the complete electrical isolation of the fan system and the control system, which is mainly implemented through an optical coupler.

Protection module: which controls the fan when the device is instable or malfunctioning during being powered on, so as to meet the heat dissipation needs of the device, and can effectively control and monitor the fan when the control system is back to normal, turns off the protection mode, connects the fan speed regulation PWM signal and the fan speed signal to the control system, that is, transfer the control to the control system, so that the control system controls and monitors the fan.

The method for isolating and protecting fan comprises the following steps.

Step A. The device (including the fan system and the control system) is powered on.

Step B. It is to boot the protection module, the fan system is controlled by the protection module and works in the protection state.

Step C. The initialization of the control system is complete (the system is booted up completely), and the protection module is notified through a control system normal operation indication signal to be ready to control the fan system.

Step D. The protection module outputs an acknowledgment feedback signal to the control system and switches the path at the same time, and thus the control system controls the fan.

Step E. The protection module real-time monitors the control system normal operation indication signal sent by the control system, and timely boots the protection module and switches the path once the system fails.

The above steps are for only the steps of booting when using the protection device, and the isolation module is always working.

Compared with the prior art: the present document takes full advantage of the existing interface of the board or the system itself and the system, such as the control system and the fan systems, and only adds an optical coupler isolation module and a protection module, which is very easy to implement. The isolation and protection method has low requirements on the system, is easy to implement, has low cost, and has universal significance, and it reduces the difficulty of system development and improves the system reliability. The system design does not need to consider providing additional circuit interfaces, thereby increasing the flexibility of system design.

The basic idea of the embodiment of the present document is: using the optical coupler to perform electrical isolation and relevant logic control, when a equipment is malfunctioning and the control system cannot properly control the fan, the protection module forcibly controls the fan to make it operate according to the conditions preset by the protection device so as to meet the heat dissipation needs of the system and achieve the purpose of protecting the equipment, moreover, it makes the circuit for implementing the function most simplified and optimized.

Hereinafter, the electronic equipment provided in the present document will be described in further detail, and it mainly comprises:

a fan system, comprising respective fans in the communication system, and one fan 40 is shown as an illustration in the drawing, an existing typical four-wire speed-regulation fan is taken as an example, the four-wire speed-regulation fan has a total of four wires, in addition to the power wire and the ground wire, it also comprises the PWM speed-regulation signal line and the FG fan speed feedback signal line, the fan speed is regulated by controlling the PWM signal, the fan operation status is monitored through the FG signal, other types of fans can be implemented by referring to this, for example, the third-wire speed fan only has the fan power positive pole, the power negative pole and the PWM fan speed-regulation signals. The fan speed feedback signal may not be needed, and the isolation protection function can be achieved without the fan feedback signal.

The isolation module 30 comprises the optical coupler 33 and the optical coupler 34 and the matching external pull-up pull-down resistor 37, it should be noted that, the optical coupler is a unidirectional device, a signal needs one coupler, i.e., a fan needs two optical couplers to isolate and transmit when the fan has two signals: PWM and FG. The external pull-up pull-down resistor mainly meets the level matching of the PWM and FG signals.

The main role of the protection module 20 is to real-time monitor the status of the control system, disconnect the connection between the PWM03 and FG03 signals of the control system with the isolation module 30 once the control system is instable or malfunctioning, meanwhile switch the operating mode and the protection module itself outputs the control signal PWM02 to control the fan and monitors the FG02 fan speed signal, the protection module 20 can be implemented through a simple logic circuit such as the PI3B16244 IC chip or PLD (Programmable Logic Device).

The working principle of the protection module 20 is real-time monitoring the "control system normal operation indication signal".

When an exception occurs, it is to disconnect the connection of the PW03 and the PW02, and disconnect the connection of the FG03 and the FG02, and switch the mode at the same time to output the PW02 signal by the protection module itself to control the fan, wherein the FG02 signal is also detected by the protection module, and this process can be understood as a switch switching process. The implementation method is: to be simple, it can directly use the "control system normal operation indication signal" to perform switch control, this signal can also be used as a trigger signal to make the protection module automatically perform the switch, for example: the protection module can set a timer counting device, and the timing counting device can be realized by logic, the control system normal operation indication signal is used as a clearing control, when the system is abnormal, such as crashed, the signal is abnormal and cannot clear the timing counting device, so that the protection module is triggered for switching when the count is full.

When the real-time monitored "control system normal operation indication signal" is normal, the protection module outputs a "protection module acknowledgment response feedback signal" to the control system to inform the control system to normally control and monitor the fan, which can be understood as transferring the controlling and monitoring right of the fan to the control system.

The main role of the control system 10 is to control speed regulation for the fan and monitor the fan in normal mode, meanwhile notify its own operation state to the protection module.

Figure 2:
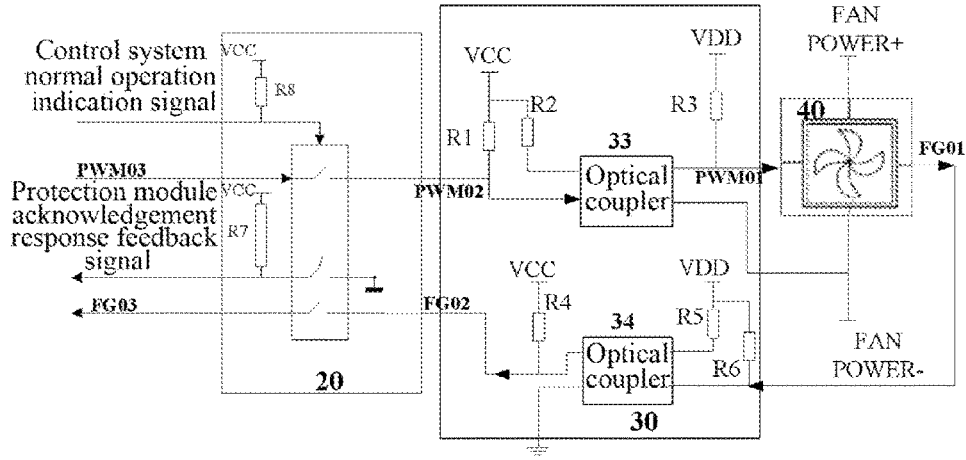
FIG. 2 is a schematic diagram of a fan isolation protection design provided in an embodiment of the present document.

FIG. 2 provides a schematic diagram of an example of isolation protection design of a fan, wherein R1~R8 are pull-up pull-down resistors, and their specific resistance values can be adjusted according to the actual needs, for example, 1 kilo-ohms or 10 kilo-ohms, etc., the VCC and the VDD are power supplies, and in the actual design, the power supply voltage can be selected according to the specifically designed circuit, for example, the VCC uses the +3.3V power supply, and the VDD uses the +5V power supply, the FAN POWER+ is the fan positive power supply, and FAN POWER− is a fan negative power supply. The logic chip illustrated in the protection module 103 represents the "PI3B16244 chip or programmable logic device (PLD)" described above. In conjunction with FIG. 2, the logic relationship in the protection module will be explained: when the system is normal, the "control system normal operation indication signal" switches from high level to low level, the switch in the logic chip is closed, the path is through, then the "protection module acknowledgment response feedback signal" turns from high level to low level after the path is through, to inform the control system to control the fan system, at this time the PWM03 connects with the PMW02, and the FG03 connects with the FG02. When the system is abnormal, the "control system normal operation indication signal" is high level, then the switch is opened, and the path is cut off.

Hereinafter, the isolation protection method embodiment of the present document will be described. In this embodiment, the isolation module always works, and herein only the protection module initialization process will be described.

Figure 3:
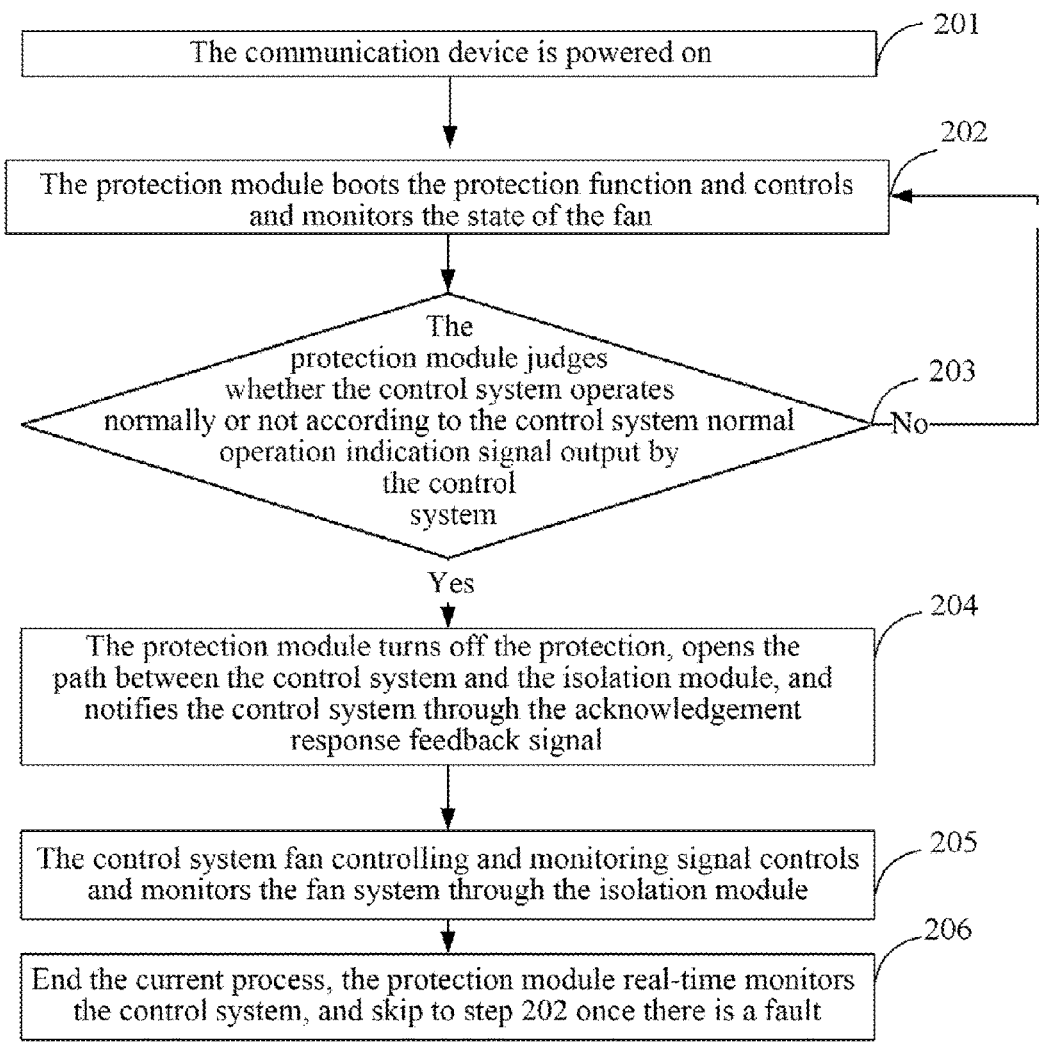
FIG. 3 is a flow chart of a method provided in an embodiment of the present document.

Herein, the process for implementing the fan isolation protection method of the present embodiment can refer to FIG. 3, mainly comprising the following steps.

In step 201, the device is powered on, which can be understood as that the system boots.

In step 202, when the system is just powered on or booted, the control system is not operating normal at this time, the fan 30 is controlled by the protection module by default, i.e. the PWM03 and the FG03 are in the disconnected state and they are not connected with the PWM02 and the FG02 respectively.

In step 203, the protection module 30 detects the "control system normal operation indication signal" to judge whether the control system operates normally or not, if yes, then it is to proceed to step 204, otherwise return back to step 202.

In step 204, it is detected that the control system operates normally, the protection module switches the switch to make the PWM03 connected with the PMW02, and the FG03 connected with the FG02, that is, the fan state controlling and monitoring signals are processed by the control system 104, and the "protection module acknowledgment response feedback signal" is used to inform the control system to hand over the fan monitoring right, so that the control system can normally monitor the fan.

In step 205, the control system 10 determines that the fan can be normally speed regulated and monitored in accordance with the "protection module acknowledgment response feedback signal", and adjusts the fan operation state as needed. At the same time, the protection module 103 also real-time monitors the "control system normal operation indication signal".

In step 206, the normal booting process ends, meanwhile, once the protection module detects that the "control system normal operation indication signal" is abnormal, it is to skip to step 202.

Finally, it should be noted that: the above embodiments are merely provided for describing rather than limiting the technical schemes of the present document, although the present document has been described in detail with reference to the preferred embodiments, those skilled in the art should appreciate that: they can still make modifications or equivalent replacements on the technical scheme of the present document, and such modifications or equivalent replacements cannot make the modified technical schemes depart from the spirit and scope of the present document.

INDUSTRIAL APPLICABILITY

In the embodiments of the present document, since the protection module outputs its own preset fan speed-regulation control signal to make the fan operate stably when the control system does not operate normally, the reliability of controlling speed regulation for a fan is enhanced and the reliability and stability of the heat dissipation fan is improved.

What is claimed is:

1. A device for controlling a heat dissipation fan, comprising: a control system for controlling a fan speed-regulation and monitoring the fan, and a protection module;

wherein the control system comprise a first signal output end for a first signal and a second signal output end for a second signal;

wherein the protection module comprise a first signal input end for the first signal and a second signal input end for the second signal;

wherein the first signal output end and the second signal output end of the control system are respectively connected with the first signal input end and the second signal input end of the protection module;

wherein the first signal is a control system normal operation indication signal output by the control system and input to the protection module, and the second signal is a fan speed-regulation control signal output by the control system and input to the protection module;

wherein the protection module further comprises a control signal output end for outputting a fan speed-regulation control signal to the fan;

wherein the protection module monitors the control system normal operation indication signal to judge whether the control system is in normal operation:

when the control system normal operation indication signal is normal, the control system is judged to be in normal operation, and the protection module controls the control signal output end to output the fan speed-regulation control signal provided by the control system;

when the control system normal operation indication signal is abnormal, the control system is judged to be in abnormal operation, the protection module outputs a fan speed-regulation control signal preset in the protection module to make the fan operate stably, wherein the protection module further comprises a third signal output end and a third signal input end for a third signal;

the control system further comprises a third signal input end for the third signal;

the third signal input end of the control system is connected with the third signal output end of the protection module, and the third signal is a fan speed signal, wherein the fan speed signal sent by the fan is input through the third signal input end of the protection module, when the control system normal operation indication signal is normal, the protection module internally connects its third signal output end with its third signal input end, so that the fan speed signal sent by the fan is directly fed back to the control system, when the control system normal operation indication signal is abnormal, the protection module internally disconnects its third signal output end and its third signal input end, so as to directly feedback the fan speed signal sent by the fan to the protection module.

2. The device of claim 1, wherein:
the protection module comprises a fourth signal output end for a fourth signal;
the control system comprises a fourth signal input end for the fourth signal;
the fourth signal input end of the control system is connected with the fourth signal output end of the protection module, the fourth signal is a protection module acknowledgment feedback signal, wherein when the control system normal operation indication signal is normal, the fourth signal output end of the protection module outputs the protection module acknowledgment feedback signal to the control system to notify the control system that the fan operation control is controlled by the control system.

3. The device of claim 1, wherein: the device further comprises an isolation module comprising a control signal input end for the fan speed-regulation control signal, the control signal input end of the isolation module is connected with the control signal output end of the protection module, the fan speed-regulation control signal output by the protection module is input through the control signal input end of the isolation module and output through the control signal output end of the isolation module via a first optical coupler provided within the isolation module.

4. The device of claim 3, wherein: the isolation module comprises a third signal output end for the third signal, the third signal output end of the isolation module is connected with the third signal input end of the protection module, the third signal is input through the third signal input end of the isolation module and output through the third signal output end of the isolation module via a second optical coupler provided within the isolation module.

5. The device of claim 4, wherein, the isolation module is further provided with external pull-up and pull-down resistors matching with the first optical coupler and the second optical coupler.

6. The device of claim 1, wherein, the protection module is an integrated circuit chip or a programmable logic device.

7. An electronic equipment, comprising a fan and the device of claim 1, wherein a fan speed-regulation control signal output by the device is connected with the fan.

8. The electronic equipment of claim 7, wherein, the fan is a four-wire speed-regulation fan or a three-wire speed-regulation fan.

9. The device of claim 1, wherein: the device further comprises an isolation module comprising a control signal input end for the fan speed-regulation control signal, the control signal input end of the isolation module is connected with the control signal output end of the protection module, the fan speed-regulation control signal output by the protection module is input through the control signal input end of the isolation module and output through the control signal output end of the isolation module via a first optical coupler provided within the isolation module.

10. The device of claim 9, wherein: the isolation module comprises a third signal output end for the third signal, the third signal output end of the isolation module is connected with the third signal input end of the protection module, the third signal is input through the third signal input end of the isolation module and output through the third signal output end of the isolation module via a second optical coupler provided within the isolation module.

11. The device of claim 10, wherein, the isolation module is further provided with external pull-up and pull-down resistors matching with the first optical coupler and the second optical coupler.

12. An electronic equipment, comprising a fan and the device of claim 4, wherein a fan speed-regulation control signal output by the device is connected with the fan.

13. The electronic equipment of claim 12, wherein, the fan is a four-wire speed-regulation fan or a three-wire speed-regulation fan.

14. An electronic equipment, comprising a fan and the device of claim 5, wherein a fan speed-regulation control signal output by the device is connected with the fan.

15. The electronic equipment of claim 14, wherein, the fan is a four-wire speed-regulation fan or a three-wire speed-regulation fan.

16. An electronic equipment, comprising a fan and the device of claim 2, wherein a fan speed-regulation control signal output by the device is connected with the fan.

17. The electronic equipment of claim 16, wherein, the fan is a four-wire speed-regulation fan or a three-wire speed-regulation fan.

18. An electronic equipment, comprising a fan and the device of claim 3, wherein a fan speed-regulation control signal output by the device is connected with the fan.

* * * * *